US010162551B2

(12) United States Patent
Leo et al.

(10) Patent No.: US 10,162,551 B2
(45) Date of Patent: Dec. 25, 2018

(54) METHOD OF SMART SAVING HIGH-DENSITY DATA AND MEMORY DEVICE

(71) Applicant: STMICROELECTRONICS S.R.L., Agrate Brianza (IT)

(72) Inventors: Marco Leo, Locate de Triulzi (IT); Paolo Rosingana, Collegno (IT); Marco Castellano, Pavia (IT); Alessandro Giuliano Locardi, Travaco' Siccomario (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 7 days.

(21) Appl. No.: 15/195,352

(22) Filed: Jun. 28, 2016

(65) Prior Publication Data
US 2017/0060467 A1 Mar. 2, 2017

(30) Foreign Application Priority Data

Aug. 27, 2015 (IT) .................. 102015000046888

(51) Int. Cl.
*G06F 3/06* (2006.01)
*G01D 9/00* (2006.01)
*H03M 7/30* (2006.01)

(52) U.S. Cl.
CPC ............. *G06F 3/0638* (2013.01); *G01D 9/00* (2013.01); *G06F 3/0604* (2013.01); *G06F 3/0673* (2013.01); *H03M 7/3091* (2013.01)

(58) Field of Classification Search
CPC .... G06F 3/0638; G06F 3/0604; G06F 3/0673; G01D 9/00; H03M 7/3091
See application file for complete search history.

(56) References Cited

U.S. PATENT DOCUMENTS

| 8,116,936 | B2 | 2/2012 | Hershey et al. | |
|---|---|---|---|---|
| 9,098,753 | B1 | 8/2015 | Zhu et al. | |
| 9,474,475 | B1 | 10/2016 | Budiman | |
| 9,735,805 | B2 * | 8/2017 | Karkkainen | ........ H03M 7/3095 |
| 2009/0184849 | A1 | 7/2009 | Nasiri et al. | |
| 2010/0073535 | A1 | 3/2010 | Huggett et al. | |
| 2012/0179680 | A1 * | 7/2012 | Isaacson | ........... G06F 17/30144 |
| | | | | 707/737 |

(Continued)

FOREIGN PATENT DOCUMENTS

WO        02/07014 A1    1/2002

OTHER PUBLICATIONS

Borcea et al., "Avatar: Mobile Distributed Computing in the Cloud," *3rd IEEE International Conference on Mobile Computing, Services, and Engineering*: 151-156, 2015.

(Continued)

*Primary Examiner* — David Yi
*Assistant Examiner* — Nicholas A. Paperno
(74) *Attorney, Agent, or Firm* — Seed IP Law Group LLP

(57) ABSTRACT

A signal interface has a compression unit and a data memory. The compression unit is configured to input an input datum from signal data generated by at least one sensor and further configured to identify the presence or absence of at least one repetition condition in the input datum. If the presence of the at least one repetition condition of the input datum is identified, the compression unit encodes the input datum in a compressed way to generate a compressed datum and saves the compressed datum in the data memory. If the presence of the at least one repetition condition of the input datum is not identified, the compression unit saves the uncompressed input datum in the data memory.

36 Claims, 8 Drawing Sheets

(56) References Cited

U.S. PATENT DOCUMENTS

| | | | | |
|---|---|---|---|---|
| 2012/0197856 A1* | 8/2012 | Banka | ................... | H04L 67/12 |
| | | | | 707/706 |
| 2012/0257626 A1* | 10/2012 | McGhee | ............ | H04L 45/7453 |
| | | | | 370/392 |
| 2012/0289788 A1* | 11/2012 | Jain | ................... | G06F 19/3418 |
| | | | | 600/301 |
| 2013/0268736 A1 | 10/2013 | Okamoto et al. | | |
| 2014/0365434 A1 | 12/2014 | Chen | | |
| 2016/0011981 A1 | 1/2016 | Leo et al. | | |
| 2016/0062768 A1 | 3/2016 | Jagannathan et al. | | |
| 2016/0210081 A1* | 7/2016 | Geisler | ................ | G06F 3/0608 |
| 2016/0342618 A1* | 11/2016 | Watkins | ............ | G06F 17/30174 |

OTHER PUBLICATIONS

Data Duplication, retrieved from http://en.wikipedia.org/w/index.php?title=Data_deduplication&oldid-673141320, retrieved on Jul. 26, 2015, 7 pages.

Douglis et al., "Application-specific Delta-encoding via Resemblance Detection," *Usenix Annual Technical Conference*: 1-14, 2003.

Filipe et al., "End-to-end data deduplication for the mobile web," *IEEE International Symposium on Network Computing and Applications*: 334-337, 2011.

Hajduczenia et al., "Deduplication of Tracked Objects Position Data at Single Observation Point of a Vessel Monitoring Systems," *Scientific Journal of PNA* 2(201): 23-32, 2015.

Italian Search Report, dated Feb. 18, 2015, for Italian Application No. IT TO20140545, 2 pages.

Italian Search Report, dated May 10, 2016, for Italian Application No. IT UB20153254, 3 pages.

Sanadhaya et al., "Asymmetric Caching: Improved Network Deduplication for Mobile Devices," *MobiCom '12*: 161-172, 2012.

Shekhar et al., "Vector Map Compression: A Clustering Approach," *GIS '02*: 74-80, Nov. 8-9, 2002.

\* cited by examiner

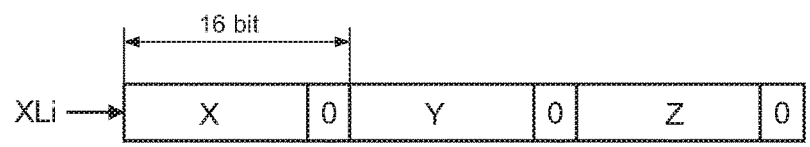
Fig.6A
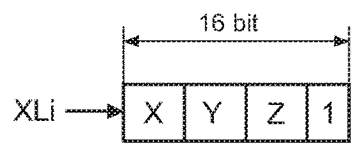
Fig.6B
|  | GY | XL | MAG | PTH |
|---|---|---|---|---|
| DSC 0 | ✓ | ✓ | ✓ | ✓ |
| DSC 1 | ✓ | | | |
| DSC 2 | ✓ | ✓ | | |
| DSC 3 | ✓ | | | |
| DSC 4 | ✓ | ✓ | ✓ | |
| DSC 5 | ✓ | | | |
| DSC 6 | ✓ | ✓ | | |
| DSC 7 | ✓ | | | |
Fig.7

Fig. 10A
Fig. 10B
Fig. 10C
Fig. 10D

| DATA TYPE | ACTION |
|---|---|
| CCC | COMPRESSION 3X |
| CCD | 1 WR COMPR2X (CC) + 2 WAIT |
| CCU | 1 WR COMPR2X (CC) + 1 WR UNCOMPRESSED |
| CDC | 1 WR COMPR2X (CD) + 2 WAIT |
| CUC | 2 WR UNCOMPRESSED + 2 WAIT |
| UCC | 1 WR UNCOMPRESSED + 1 WAIT |
| DCC | 1 WR COMPR2X (DC) + 2 WAIT |
| CUD | 2 WR UNCOMPRESSED + 2 WAIT |
| CUU | 3 WR UNCOMPRESSED |
| CDU | 1 WR COMPR2X (CD) + 1 WR UNCOMPRESSED |
| CDD | 1 WR COMPR2X (CD) + 2 WAIT |
| UCU | 3 WR UNCOMPRESSED |
| UCD | 1 WR UNCOMPRESSED + 1WR COMPR2X (CD) + 3 WAIT |
| DCU | 1 WR COMPR2X (DC) + 1WR UNCOMPRESSED |
| DCD | 1 WR COMPR2X (DC) + 2 WAIT |
| UUC | 2 WR UNCOMPRESSED + 2 WAIT |
| UDC | 1 WR UNCOMPRESSED + 1WR COMPR2X (DC) + 3 WAIT |
| DUC | 2 WR UNCOMPRESSED + 2 WAIT |
| DDC | 1 WR COMPR2X (DD) + 2 WAIT |
| UUU | 3 WR UNCOMPRESSED |
| UUD | 2 WR UNCOMPRESSED + 2 WAIT |
| UDU | 3 WR UNCOMPRESSED |
| DUU | 3 WR UNCOMPRESSED |
| DDU | 3 WR UNCOMPRESSED |
| DUD | 2 WR UNCOMPRESSED + 2 WAIT |
| UDD | 1 WR UNCOMPRESSED + 1 WR COMPR2X (DD) + 3 WAIT |
| DDD | 1 WR COMPR2X (DD) + 2 WAIT |

Fig.12

METHOD OF SMART SAVING HIGH-DENSITY DATA AND MEMORY DEVICE

BACKGROUND

Technical Field

The present disclosure relates to a method of smart saving high-density data and to the memory device. Specifically, the disclosure regards a device having a storage element for saving data supplied by inertial sensors, environmental sensors, position sensors and their derivatives, for example MEMS (Micro-Electro-Mechanical System) sensors.

Description of the Related Art

As is known, current mobile devices, such as cellphones, tablets, palm-tops, portable or wearable electronic devices, inertial-navigation devices, automotive systems, robotic systems, etc., enable collection of large amounts of inertial and environmental data that are used in an ever-increasing number of applications and programs. In particular, such devices may be sensors for detecting physical quantities, such as inertial sensors, which detect data on acceleration and angular velocity; position sensors, such as magnetometers and proximity sensors; sensors of derived signals, such as quaternions (data representing rotations and directions in three-dimensional space) and gravity signals; motion detectors, such as step counters, running counters, uphill counters, etc.; and environmental signals, which detect quantities such as pressure, temperature, humidity, and brightness, used in various applications.

In general, the data acquired by the sensors are saved to a suitable data memory so that, at each moment, the device memory contains a "history" of the latest values of the saved data, the length whereof is linked to the available memory spaces.

On the other hand, current applications using the above data acquire and save an ever-increasing number of data, even in rest conditions of the mobile devices. In particular, new devices and applications require both an increase of acquired signals and physical quantities (increase of the "type" of data), and an increase of the data "history", in terms of number of previous saved samples referring to a same quantity signal. This leads to a demand for an ever-increasing storage capacity, which is contrast with requirements of containment or even reduction of the size and of the costs of the mobile devices as a whole.

Furthermore, the acquired data have different variability in time, in particular a variability that is even very low, and may be substantially constant even for long periods. For instance, position data are normally substantially constant when the mobile device is in a fixed position, for example laid down on a surface, but saving the data requires the same space in memory as do data that vary rapidly.

In fact, current devices, and their memories, whether embedded or not, do not carry out any control over the data values, and these occupy the same space in memory, even though the values remains practically the same or very similar.

Thus, the problem exists of improving efficiency of saving data in mobile devices, irrespective of any possible increase of the memory size.

The subject matter discussed in the Background section is not necessarily prior art and should not be assumed to be prior art merely as a result of its discussion in the Background section. Along these lines, the recognition of one or more problems in the prior art discussed in the Background section and the subject matter associated therewith should not be treated as prior art unless expressly stated to be prior art. Instead, the discussion in the Background section encompassing one or more recognized problems in the prior art should be treated as part of the inventor's approach to the particular problem, which in and of itself may also be inventive.

BRIEF SUMMARY

The aim of the present disclosure is to provide a method and a device that overcomes the limitations of the prior art solutions.

According to the present disclosure a method for managing data and a memory device are provided.

The idea underlying the disclosure consists in providing a method for storing sensor data, wherein the data having particular high-repetitiveness conditions (for example, the most likely data or the data having, at least in some working conditions, a certain degree of repetitiveness or of limited variability with respect to data previously acquired or saved standard data) are compressed, whereas data with low repetitiveness are stored in a non-compressed way (in the present context, the term "data" refers to the values associated to physical quantities measured by sensors, values of signals acquired by sensors, or information deriving from processing these signals). In this way, more repetitive data requires a smaller saving space than does less repetitive data, thus leading to a marked saving of space in so far as the reduction of size regards precisely the data to be saved more frequently.

According to one embodiment, the compression is carried out on the basis of the difference with respect to a reference datum formed, for example, by a previous datum, such as the last datum saved in a non-encoded way, by a particular value, for example the mean value of the signal supplied by a sensor, or by a statistically significant value. Each datum is compared with the reference datum. If the difference between them is greater than a given threshold, the new datum is saved in a non-compressed way. If the difference is less than the threshold, the new datum is compressed so as to reduce the size thereof.

For instance, the new datum may be compressed by saving just the difference with respect to previous datum.

Furthermore, a label may be provided, which is stored together with just the compressed datum, with just the non-compressed datum, or with both data, and represents the state, whether compressed or not, of the respective datum saved.

In another embodiment, different compression levels may be provided, based on the speed of change of the data. For example, if a new datum only slightly differs or is the same as a previous datum, it is compressed more heavily (i.e. with a lower number of bits); if a new datum differs from a previous one within a variability window, it is compressed less (e.g. with a higher number of bits), and if the new datum is decidedly different from a previous one, it is not compressed. A tag may indicate the type of compression or no compression; in addition, if a number of following data, e.g., three, are highly compressible, they may be joined in a single byte.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. For a better understanding of the present disclosure, preferred embodiments thereof are now described, purely by way of non-limiting example, with reference to the attached drawings, wherein:

FIGS. 6A and 6B show an embodiment of a saving mode of non-compressed and compressed data, respectively, according to an embodiment of the present method;

FIG. 7 shows an embodiment of a sequence configuration for saving different signals of the sensors of the device of FIGS. 5A-5C;

FIGS. 10A, 10B, 10C, and 10D show possible configurations of a data byte according to yet another embodiment of the present method;

FIG. 12 is a table representing another different embodiment of the method for saving data according to the present disclosure.

DETAILED DESCRIPTION

Figure 1:
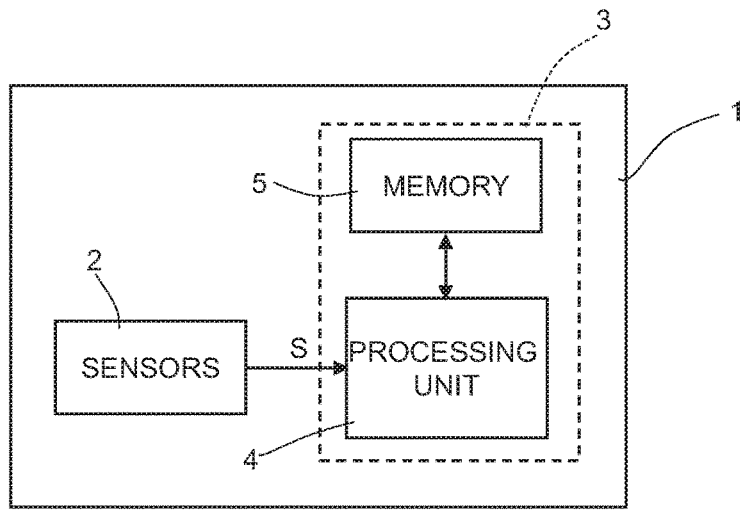
FIG. 1 is a general block diagram of an electronic device comprising a data memory.

FIG. 1 shows a generic electronic device 1 comprising a generic sensor 2 and a generic data-storage device 3. In turn, the data-storage device 3 comprises a processing unit 4 and a data memory 5. The data memory 5 may be integrated in the processing unit 4 (embedded solution) or separate therefrom.

The sensor 2 measures a physical quantity of an inertial, environmental, or position type and outputs a signal S representing the value of the measured quantity or of processing result thereof (derived quantity). The signal S is discretized and, in general, has one or more states that are more likely than one or more other states. For instance, the signal S having the time plot represented in FIG. 2 has two more frequent states, designated by S1 and S8, as may be seen also from the discrete probability distribution of FIG. 3.

In this situation, the processing unit 4 encodes the signal S so that the more frequent states (here, the two states S1 and S8) require a smaller number of bits (and are compressed) with respect to less likely states (S2-S7 in the example). The data memory 5 thus stores sequences of data including encoded data (also referred to hereinafter as "compressed data") and data in their original form, as received from the sensor 2 (also referred to hereinafter as "non-compressed data" or "input data").

To distinguish the compressed data from the non-compressed data, the former are associated to (for example, preceded or followed by) a tag T, which may assume for example two values: T1, denoting a compressed datum, and T2, denoting a non-compressed datum.

Figure 4:
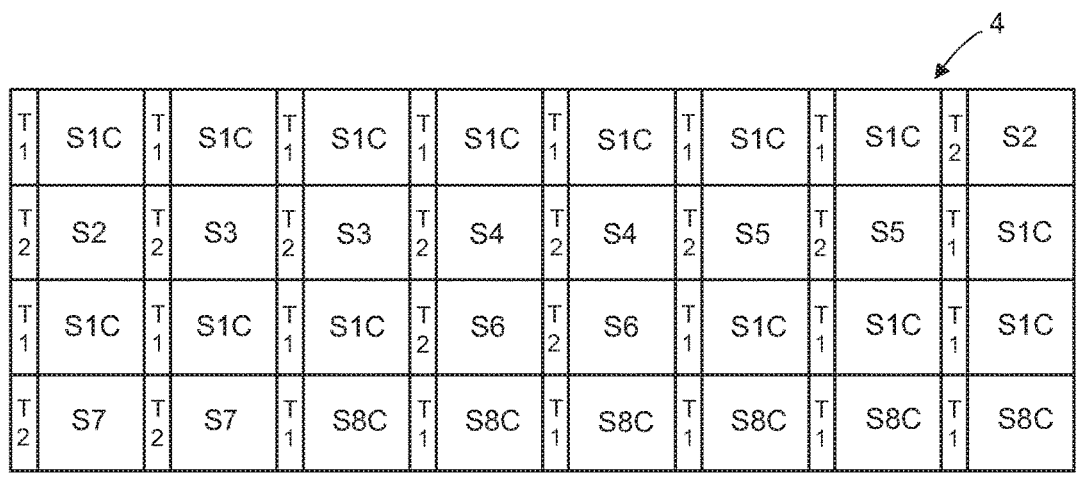
FIG. 4 shows a possible configuration for saving data according to an embodiment of the present method.

For instance, the memory 5 may be configured in the way illustrated in FIG. 4 so that, for example, a compressed datum occupies half the memory space occupied by a non-compressed datum. In FIG. 4, the data regarding the two states S1 and S8 in compressed form are designated by S1C and S8C, preceded by the tag T1, and the data referring to the same states S2-S7 in the non-compressed form are designated by S2-S7, preceded by the tag T2, where the storing unit (corresponding to a compressed datum or half of a non-compressed datum, and corresponding tags) may, for example, be 1 byte (8 bits) in length. In this way, for example, a non-compressed datum may occupy 2 bytes, and a compressed datum may occupy 1 byte.

The more frequent data may be identified in a self-learning step or while setting the device 1.

Figure 2:
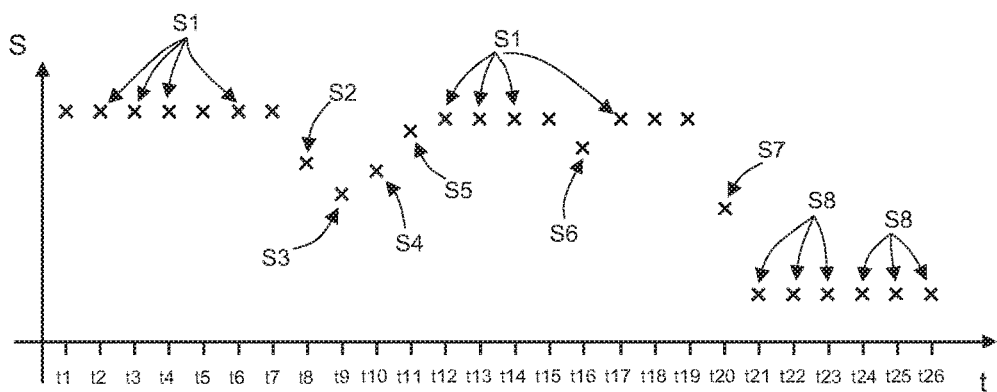
FIG. 2 shows an example of data acquired by the device of FIG. 1.
Figure 3:
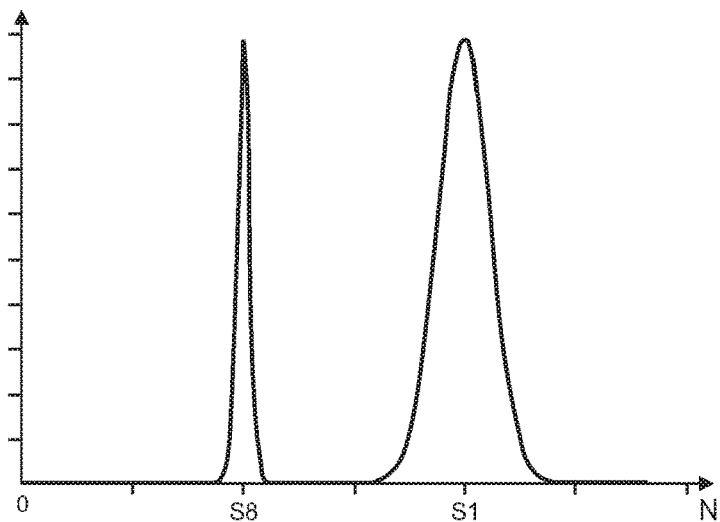
FIG. 3 shows the discrete statistical distribution of the data of FIG. 2.

In this way, to save the twenty-six data illustrated in FIG. 2 (twenty whereof are the more frequent states S1, S8), 32 bytes are used, far below what required for non-compressed storage.

According to a different embodiment, instead of establishing beforehand the more frequent states and saving only the compressed ones, it is possible to compare each datum with a preceding datum. If the difference is less than a preset threshold, only the difference is saved, using a smaller number of bits. In this way, assuming that, in the example of FIG. 2, just states S1 (first instant t1), S2, S3, S5, S6, S1 (instant t17), S7, and S8 (first instant t21) present a significant difference with respect to the previous datum, only the eight data referred to above are saved in complete form, and all the other eighteen data are stored as difference (possibly even zero) with respect to previous datum. In this way, data storing is obtained in a much smaller memory space than required by the non-compressed data because of the lower number of bits used for storing the difference.

Figure 5A:
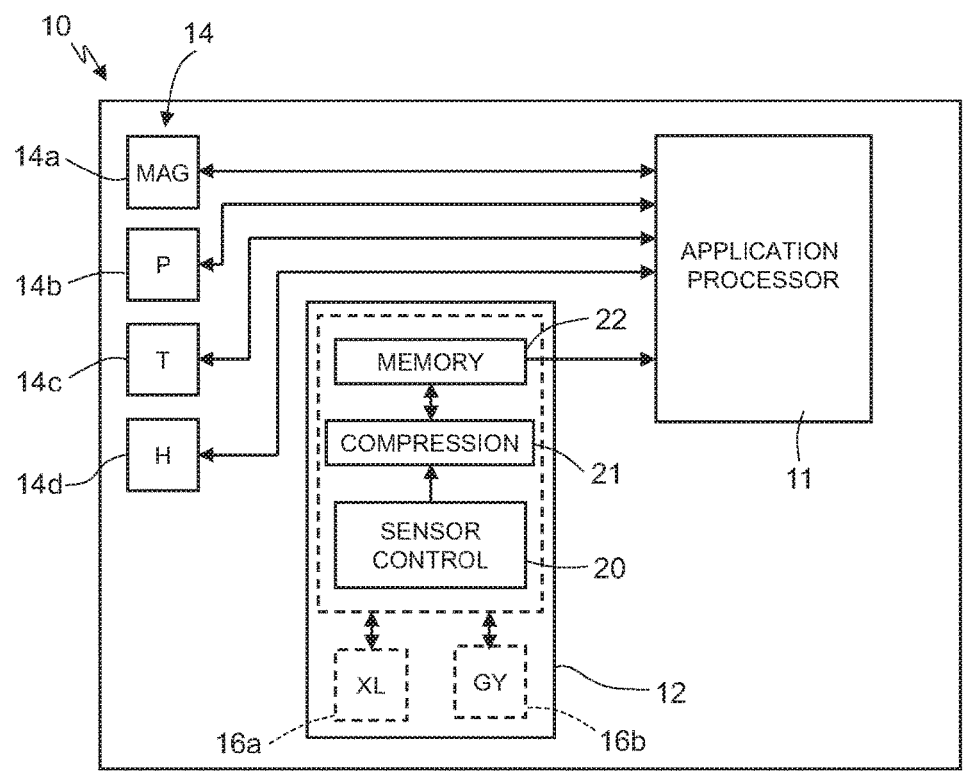
FIGS. 5A-5C show schematic block diagrams of an electronic mobile device comprising a plurality of sensors and a data memory.
Figure 5B:
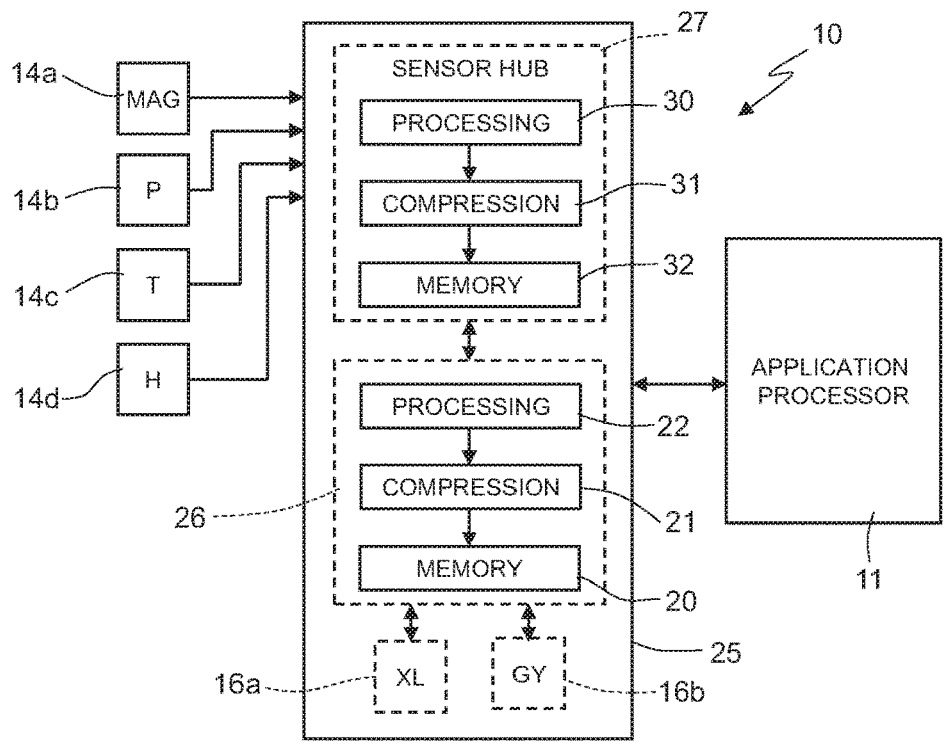
Figure 5C:
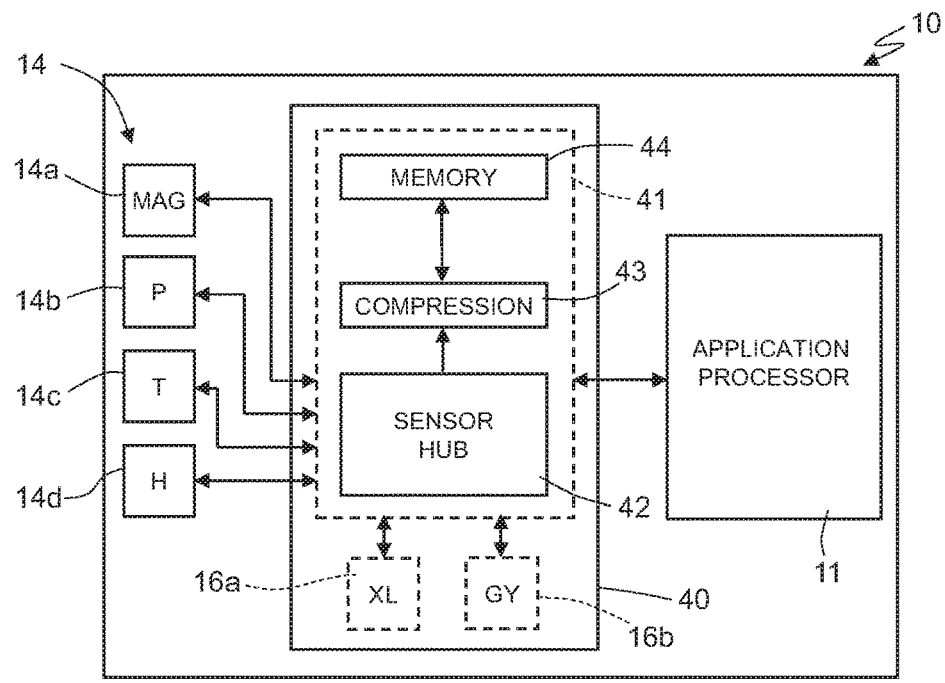

FIGS. 5A-5C show possible applications of the principle set forth above, regarding an electronic device 10, typically a mobile device, such as a cellphone, a smartphone, a PDA (Personal Digital Assistant), a digital audio player with voice-recording capacity, a photographic camera or a video-camera, a controller for video games, or a wearable device, such as, for example, a smartwatch or an electronic bracelet. The electronic device 10 is generally able to process, store, and/or transmit and receive signals and information. In the illustrated architectures, the device 10 comprises a plurality of first sensors 14 that are stand-alone, and a plurality of second sensors 16, integrated in a single packaged device together with the relevant management unit. Other solutions are, however, possible, with all sensors manufactured separately or all packaged sensors in a single device.

In the embodiment of FIG. 5A, generally and as to elements that are important for the present description, the electronic device 10 comprises an application processor 11, a sensor interface 12, and the plurality of first sensors 14.

The application processor 11, which for example implements an operating system of the device 10, may be formed by a controller or processor directly connected to the interface 12 and to the first sensors 14.

The interface 12 comprises, integrated therein, the second sensors 16 and executes operations for their control and for initial processing of the signals supplied thereby. In the illustrated embodiment, the interface 12 comprises a control unit 20, a compression unit 21, and a data memory 22, in addition to the plurality of second sensors 16.

For instance, the interface 12 may comprise a microcontroller (μC), a microprocessor, a DSP (Digital Signal Processor), an FPGA (Field Gate Programmable Array), an ASIC or similar computing unit, in addition to the second sensors 16.

The data memory 22, which is generally of a volatile type, such as a RAM, stores the data acquired by the sensors 16. For instance, the data memory 22 may be a FIFO (First In, First Out), a LIFO (Last In, First Out) type, or comprise registers of some other type.

With the architecture of FIG. 5A, the application processor 11 directly receives the data supplied by the first sensors 14, manages as well as, possibly, compresses them. The application processor 11 also receives the compressed data from the interface 12 and uses them on the basis of the envisaged applications.

As an alternative to the above, the application processor 11 does not control and compresses the data of the first sensors 14, and these functions are entrusted to an interface 12 which manages all the sensors 14, 16 and processes the data thereof. For instance, FIG. 5B shows an architecture comprising an interface 25 that includes a second sensor managing unit 26, similar to the interface 12 of FIG. 5A, and a first sensor managing unit or sensor hub 27. Here, the sensor hub 27 comprises a signal-processing unit 30, a processing unit 31, and a data memory 32.

In FIG. 5B, the data of the first and second sensors 14, 16 are processed and compressed separately. They may then be stored and processed separately and supplied to the application processor 11; or one of the two management units, for example the second sensor managing unit 26, may operate as the main unit, receiving the already processed and compressed data of the first sensors 14, gathering the data of the second sensors 16, and storing all the data together, before supplying them to the application processor 11. As an alternative to the above, for instance just some of the data, for example the data of the second sensors 16, may be compressed.

According to another variant (illustrated in FIG. 5C), a single interface 40 comprises a single sensor managing unit 41 and the second sensors 16. The sensor managing unit 41 in turn includes a sensor hub 42, a compression unit 43, and a data memory 44. In this case, the sensor hub 42 gathers the data of all the sensors 14, 16, carries out possible preliminary processing operations, generating derived data, and supplies the latter to the compression unit 43.

In the illustrated examples, the first sensors 14 are of a magnetic and environmental type, and comprise a magnetometer 14a, which is of a triaxial type and supplies a magnetic-field signal MAG[x, y, x] indicating the magnetic field measured along three axes X, Y, Z of an inertial reference system; and three environmental sensors, which include a pressure sensor 14b, supplying a pressure signal P, a temperature sensor 14c, supplying a temperature signal T, and a humidity sensor 14d, supplying a humidity signal H.

The second sensors 16 may comprise, for example, an accelerometer 16a, which is of a triaxial type and supplies an accelerometric signal XL[x,y,z] indicating the accelerations acting in the electronic device 10 along the three axes X, Y, Z; and a gyroscope 16b, which is also of a triaxial type and supplies a gyroscopic signal GY[x,y,z] indicating the angular velocity acting about the three axes X, Y, Z.

The environmental sensors 14a, 14b and 14c supply data in a just one dimension, but these data may be combined so as to provide together a three-dimensional environmental signal, no longer referring to the cartesian axes, but having a structure similar to acceleration XL, angular velocity GY, and magnetic field MAG signals (combined signal PTH).

For this reason, in the following description, the term "datum" will be used, except where otherwise specified, to designate a three-dimensional datum (acceleration datum XL, angular-velocity datum GY, magnetic-field datum MAG, or environmental datum PTH), and the term "dimension" of the three-dimensional datum regards the individual components along the axes X, Y, and Z in the case of the acceleration datum XL, the angular-velocity datum GY, the magnetic-field datum MAG, and the pressure, temperature, or humidity signals in the case of the environmental datum PTH.

Obviously, the structure described is provided only by way of example, and different signals, in a number greater or smaller than what is illustrated in FIGS. 5A-5C, may be detected by the sensors 14, 16 and/or the signals may have a different number of dimensions.

Hereinafter, it is assumed that signals XL, GY, MG, and PTH supplied by the sensors 14-16 are already discretized and digitalized and that the environmental sensors 14b-14d managing unit (in the application processor 11, or in the sensor hub 27 or 42) receives the "one-dimensional" data of the environmental sensors 14b-14d and combines them to obtain a "three-dimensional" environmental datum, as discussed above, in a known way.

The signals XL, GY, MAG, and PTH may have discrete probability distributions. For instance, when the electronic device 10 remains stationary, resting on a table or other surface for a certain time, the signals acquired by the sensors 14, 16, and thus the data received by the application processor 11 or by the interface 12, 25 or 40 remain the same or substantially the same for long periods of time.

The repetitive data acquired by the application processor 11 or by the interface 12, 25, or 40 may thus be encoded in a compressed way, as difference with respect to the previous homologous datum, if the difference is less than a preset threshold, associating a compression tag, indicating whether the saved datum is compressed or not.

In the considered example, and in a non-limiting way, it is assumed that the device 10 has the architecture of FIG. 5C, and that the sensor hub 42 acquires signals XL, GY, MG, P, T, and H from the sensors 14, 16 and organizes them preliminarily, to be saved in the data memory 44, on six bytes formed by three pairs of bytes, where each pair of bytes represents the input data referring to one of the three axes X, Y, Z for each of the signals XL, GY, MG and/or the input data referring to the signals P, T, or H for the combined signal PTH, which includes a compression-tag bit. In this way, two bytes encode the datum measured for the axis X or a first environmental signal, two bytes encode the datum measured for the axis Y or a second environmental signal, and two bytes encode the datum measured for the axis Z or a third environmental signal.

FIG. 6A shows an exemplary organization of the data to be stored in a non-compressed way in the data memory 44, according to the above. In the illustrated embodiment, the input datum (for example, regarding the i-th accelerometric signal XL) is encoded with fifteen data bits and one tag bit for each axis so that the triad of values associated to the three-dimensional datum measured in each cycle, for each three-dimensional signal (whether simple or combined, as for the environmental signal PTH) is encoded in non-compressed form in three pairs of bytes, i.e., forty-eight bits. In the illustrated embodiment, the compression tag T is arranged after the fifteen bits of the one-dimensional datum, but could be arranged before.

FIG. 6B shows, instead, the organization of the compressed data via five bits for each dimension so that the three-dimensional datum in the compressed form (with reference to the i-th accelerometric signal XL) that includes just one bit for the compression tag, may be saved in two bytes (sixteen bits). In this way, storing a compressed datum in the data memory 44 requires a space three times smaller than a non-compressed datum.

Once again by way of example, it is assumed that the sensors 14, 16 work at different ODRs (Output Data Rates), for example submultiples of a maximum ODR. For instance, the accelerometer 16a may work at 100 Hz, the gyroscope 16b may work at 200 Hz, the magnetometer 14a may work at 50 Hz, and the environmental sensors 14b-14d may work at 25 Hz. It is further assumed that the data of the sensors 14, 16 are simultaneously supplied to the compression unit 43 so as to be synchronous, although they may not always be present simultaneously.

According to a possible implementation, the data of the sensors 14, 16 are saved at a rate equal to the least common multiple between the ODRs of the different sensors. Thus, in the example indicated above, the data memory 44 is updated at the frequency of 200 Hz, with DSCs (Data-Storing Cycles) every 5 ms.

To exploit the data memory 44 efficiently, at each DSC, only the new data supplied by the sensors 14, 16 are saved on the basis of the respective ODR, as described in detail in Italian patent application No. TO2014A000545, filed on Jul. 8, 2014, and included herein by reference. In particular, the saving sequence may follow the configuration represented via the memory array 50 illustrated in FIG. 7. Here, DSC1-DSC8 are the eight different data-storage cycles provided for by the memory array 50 (after which the sequence repeats) and the tick "V" indicates when the specific datum is acquired and saved in the generic i-th DSC considered.

Using the memory array 50 of FIG. 7, the data saving sequence in the data memory 44, at the frequency of 200 Hz, may for example be the following:

GY0, XL0, MAG0, PTH0, GY1, GY2, XL2, GY3, GY4, XL4, MAG4, GY5, GY6, XL6, GY7, . . . , where GY0-GY7 are the angular-velocity data supplied in the cycles DSC0-DSC7; XL0, XL2, XL4, XL6 are the acceleration data supplied in the cycles DSC0, DSC2, DSC4, and DSC6; MAG0, MAG4 are the magnetic-field data supplied in the cycles DSC0, DSC4; and PTH0 are the pressure, temperature, and humidity data supplied in the cycle DSC0.

Figure 8:
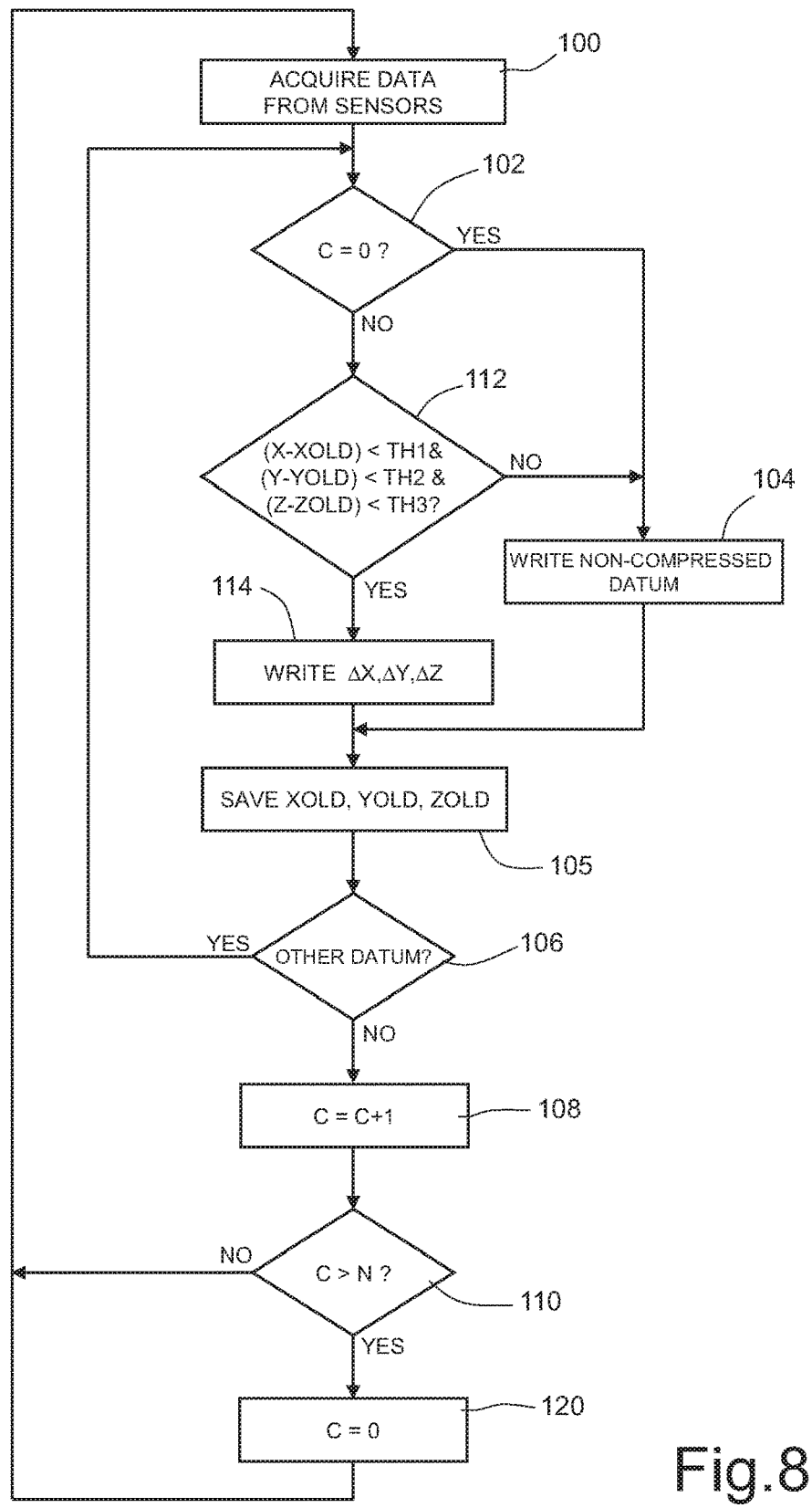
FIG. 8 is a simplified flowchart showing a possible embodiment of a method for saving data according to the present disclosure.

On this hypothesis, writing or saving data in the data memory 44 may be carried out in the way described below and represented in FIG. 8, where it is assumed that, every N data-acquisition cycles, the data are in any case saved in non-compressed form. For instance, N may be the number of data-acquisition cycles provided for in memory array 50 (here eight) or a multiple thereof.

In detail (step 100), initially the sensor hub 17 acquires the new data supplied by the sensors 14, 16 and organizes them in two-byte triplets, as described above. Then, the compression unit 43 verifies whether a partial counter C of the number of performed data-acquisition cycles is equal to 0 (step 102). In this case (output YES from step 102), a two-byte datum is saved in non-compressed form (step 104). For instance, assuming that storage cycle is DSC0, the three-dimensional angular-velocity datum GY0 is written, according to the scheme of FIG. 6A.

Next (step 105), the non-compressed datum is temporarily saved as "old datum", to be used in a subsequent storage cycle. For this purpose, the individual values XOLD, YOLD, and ZOLD of the respective angular-velocity datum, acceleration datum, magnetic-field datum, and environmental datum are separately saved (in the present case, the values along the three axes of the angular-velocity datum GY0 are thus saved).

Then (step 106), it is verified whether, on the basis of the memory array 50, a further datum is to be saved in the same cycle and if so (output YES from step 106) control returns to step 102. In the present example, then, the described sequence is repeated (steps 102, 104, and 106) for each of the three-dimensional data, i.e., the acceleration datum XL0, the magnetic-field datum MAG0, and the environmental datum PTH0, and they are saved in a non-compressed way in the data memory 20 in step 104, and are temporarily saved as XOLD, YOLD, and ZOLD for the specific datum, in step 105.

At the end of data writing of a same storage cycle, i.e., when all the data specified by the memory array 50 for the considered count cycle have been saved (output NO from step 106), the partial cycle counter C is increased (step 108), and it is verified whether the partial cycle counter C has reached the maximum value (step 110). If it has not (output NO from step 110), the process returns to step 100, with acquisition of a new set of data. Thus, in the above example, the partial cycle counter C has been incremented to 1, and the new set of data acquired in step 100 includes just the three-dimensional angular-velocity datum GY1, according to the scheme of FIG. 6A.

When the partial cycle counter C has a value other than 0 (output NO from step 102), it is verified whether the new data and the previous ones differ significantly and they may be saved in compressed format. Then (step 112), the datum just acquired is compared, for each dimension, with the previous values XOLD, YOLD, and ZOLD. Thus, in the present example the values on the three axes of the three-dimensional angular-velocity data GY1 are compared with the corresponding previous values.

If the differences between the previous values and the just acquired ones are lower than respective thresholds TH1, TH2, TH3 for all three dimensions (i.e., for all three axes, in the case of the triaxial signals, and for all three values, in the case of the environmental signals) (output YES from step 112), just the differences (on the three axes) between the previous datum and the datum just acquired are written in the data memory 44 according to the scheme of FIG. 6B (step 114), and the datum just acquired, for the signal considered, is saved as XOLD, YOLD, and ZOLD in step 114.

Instead, if the differences between the previous values and the just acquired ones are higher than the thresholds TH1, TH2, TH3 for at least one of the three dimensions (output YES from step 112), the new datum is saved in a non-compressed form in step 104, with the scheme illustrated in FIG. 6B, as described above, and the non-compressed datum is saved for each dimension, overwriting the three values on the previous ones for the same signal (step 105). Thus, in the present example the three-dimensional angular-velocity data GY1 is written instead of the datum GY0, as previous value, whether it is saved in a compressed form or it is saved in a non-compressed form.

The process described above with reference to steps 100-110 is repeated, on the basis of the memory array 50, until the partial cycle counter C reaches value N. In this case (output YES from block 110), the partial cycle counter C is reset (step 120), and the process continues with acquiring a new set of data (step 100) and saving them completely (step 104), as described previously.

In this way, the data memory 44 is written with a plurality of data that, at least in some operational situations of the device 10, are encoded in a compressed way and thus require much less space. Consequently, for a same size of a memory, on average, the data memory 44 is able to save a much larger number of data than without compressed saving.

During reading, a first pair of bytes that includes the compression tag is read, and it is verified whether the associated datum is compressed or not. If the compression tag indicates a compressed datum, the next fifteen bits are divided into three parts, each of which is associated to a different dimension of the datum, and the five bits of each part are added to the value of the datum previously decoded for the same dimension (axis X, Y, or Z if the signal is three-dimensional, or a different signal, if the datum is composite). The datum thus reconstructed is then temporarily saved so that it may subsequently be used in the reconstruction of a subsequent datum saved in a compressed form and outputted for further processing operations by the device 10.

If the compression tag indicates a non-compressed datum, the fifteen bits of the same byte are attributed to a first dimension (component X of the read signal or pressure signal P, in the present example) on the basis of the memory array 50 of FIG. 7. The next two bytes are then read and are attributed to the next two components (components Y and Z of the read signal, or temperature signal T and humidity signal H, in the present example). The just read values are temporarily saved so that they may subsequently be used in the reconstruction of a subsequent datum saved in a compressed form and outputted for further processing operations by the device 10. The procedure is then repeated for the subsequent bytes.

As an alternative to the above, the interface 40 may directly output the compressed data, taking care to verify each time the compression tag and update the pointers in order to take into account the sequence and the different lengths of the compressed data and non-compressed data.

According to another embodiment, different compression levels may be provided, based on the speed of change of the data. For example, difference of a new datum with respect to a previous saved datum may be checked. If the difference is low, a first, higher, compression may be performed. If the difference is higher, but not exceeding a threshold, a second, lower, compression may be performed. If the difference is high, no compression may be performed. A group of three subsequent data may be checked, and the first, second or no compression may be applied, based on the detected changes (differences) for all of them or two subsequent data.

In the following, embodiments of this method will be described based on an architecture similar to the one of FIG. 5C, but it applies to the architectures of FIGS. 5A and 5B as well, with appropriate adaptations.

Figure 9:
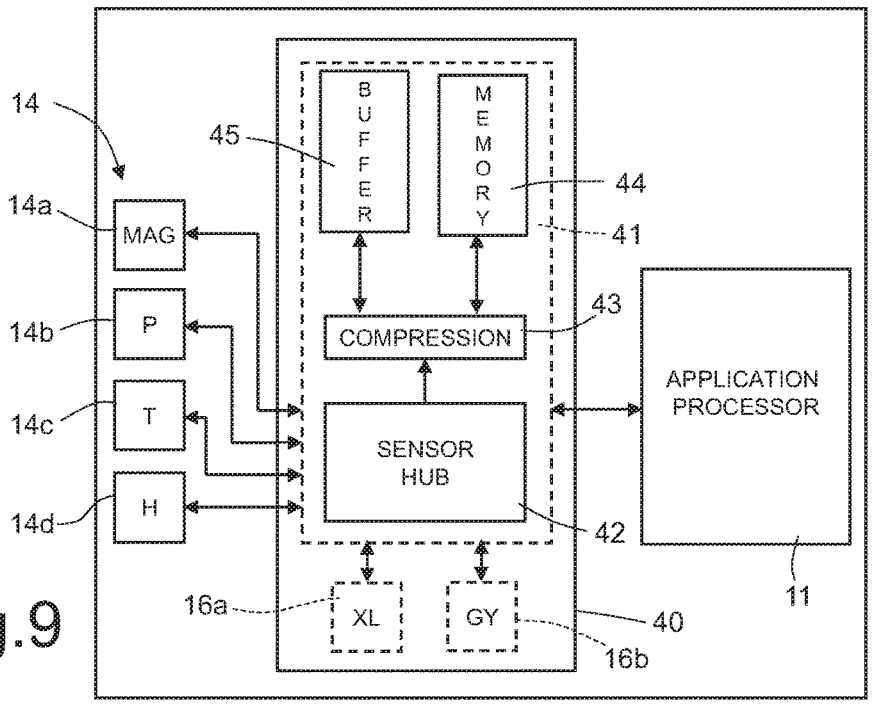
FIG. 9 shows a schematic block diagram of another electronic mobile device comprising a plurality of sensors and a data memory.

With reference to FIG. 9, a register 45 may be coupled to the compression unit 43. The register 45 may be volatile memory or a buffer, including a plurality of fields for loading a plurality of data. The other units are the same as in FIG. 5C.

In an embodiment, three consecutive data (each data comprising three dimensions, as above discussed, are loaded into register 45. The register 45 may comprise four fields, a first field for a last saved data (defining a reference datum) and three fields for data to be checked. The differences between each loaded data and the reference datum are checked to determine whether the three loaded data are to be compressed and which compression level may be applied.

In a different embodiment, the reference datum is the last checked datum and each loaded datum is compared with a previous one.

Comparing is done by comparing the calculated differences with two thresholds. Then, the following situations may arise:

ONE: All three differences are lower than a first threshold. In this case, the three data are considered 3×-compressible. The three data may compressed together as a single byte; a 3× tag may be added. Saving of the data may be done by saving the differences. Since the calculated differences are small, they may be in fact coded with a first, low number of bits. For example, the threshold may be 5 bits (that is all checked data in the register 45 differ by less or at most five bits from the previous (saved) one; thus, each difference may be coded by five bits. For example, for a 48 bit-word (or byte) as shown in FIG. 10A, the 3×-compression of FIG. 10B may be performed, wherein each loaded datum from the sensors 16, 14 (three-dimensional datum from sensors 16a, 16b, 14a or combined datum from sensors 14b, 14c, 14d) is coded by 16 bits (15 bits for each datum plus a parity bit, as explained below).

TWO: Any of the three differences is higher than the first threshold but the differences of two consecutive loaded data are lower than a second threshold and higher than the first threshold. In this case, the two consecutive data are considered 2×-compressible. Thus, the two consecutive data are compressed in a single byte and a 2× tag may be added. Saving of the 2×-compressed data may be done also here by saving the differences. Since these differences are not too high, they may be in fact coded with a second number of bits. For example, the threshold may be 8 bits; thus, each difference may be coded by eight bits. Thus, e.g., the 2×-compression of FIG. 10C may be performed, wherein each loaded datum from a sensor is coded by 24 bits. Parity bits may be added, as well, as explained below.

THREE: No two consecutive loaded data may be compressed, either 2× or 3× (typically, the second loaded datum is higher than the second threshold). The datum that cannot be compressed and, in this case, the previous one is/are saved in uncompressed form. In the considered example of a 48 bit-word, for example, each uncompressed datum may be saved as shown, e.g., in FIG. 10D.

Figures 10A, 10B, 10C, 10D:
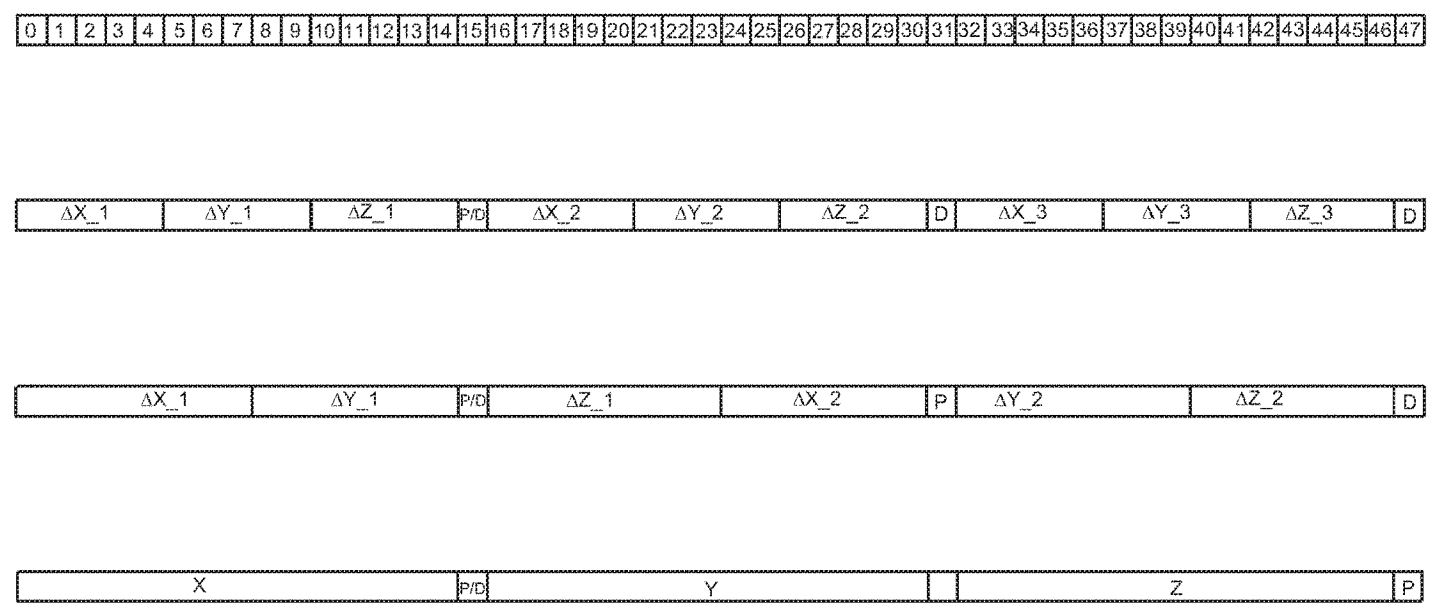

In the exemplary compression mode of FIGS. 10B-10D, as indicated, positions 15, 31 and 47 store parity bits that may be used for encoding useful information, including which data have been written and whether data are compressed. For example, in a two-sensor, six-axis inertial system, bit 15 may encode the sensor generating the data (in this case a single bit is sufficient to this aim bit 31 may encode whether the data are compressed or not; and bit 47 may encode whether any compression is a 2× or a 3× compression.

The sequences of data from the sensors may be compressed and supplied to the application processor 11 in different ways.

Figure 11:
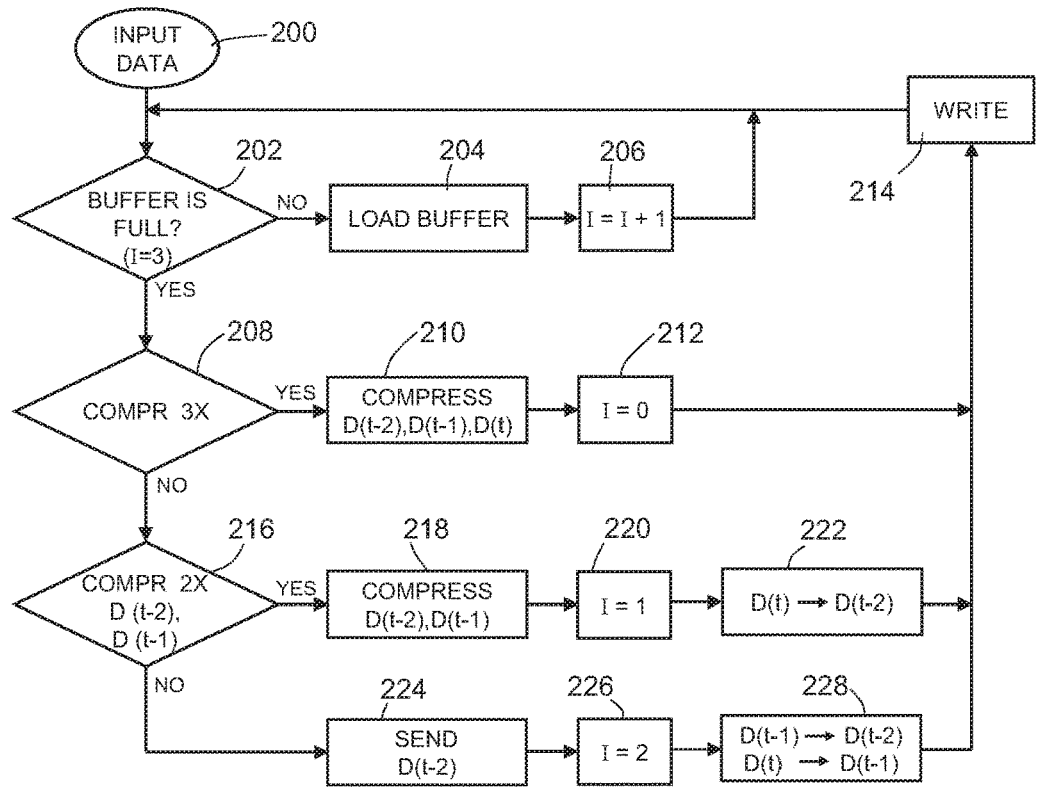
FIG. 11 is a simplified flowchart of a different embodiment of the method for saving data according to the present disclosure.

For example, FIG. 11 is a flowchart of a medium efficiency processing method that is characterized by its simplicity of implementation. Compression performed according to the flow-chart of FIG. 11 makes reference to the architecture of FIG. 10, but is applicable also to the architectures of FIG. 5A or 5B, provided that corresponding buffer(s) is (are) provided.

The method of FIG. 11 provides for the buffer 45 to be always filled by three consecutive data to be checked; if no 3× compression is possible, the first two loaded data are checked to evaluate whether a 2× compression is possible; if not, the first loaded datum is saved in uncompressed form.

In both cases, after storing the processed data in the memory 22, the buffer is filled again and the loaded data are checked again.

In detail, the process begins at step 200, when a datum is input. In step 202, the compression unit 21 of FIG. 9 checks whether the buffer has been filled with three data to be checked, by verifying whether an index I is equal to 3. If not, output NO from step 202, a subsequent datum is loaded into the buffer 45, step 204, and index I is incremented by one unit, step 206. Then, filing of the buffer 45 is checked again in step 202.

When the buffer 45 is full, output YES from step 202, the compression unit 43 checks whether the data loaded in the buffer 45 may be compressed 3× by checking whether the difference with respect to the reference datum is lower than the first threshold (e.g., they differ at most by five bits), step 208. If so, output YES from step 208, the three loaded data in the buffer 45 are compressed by preparing a bus of three compressed data, e.g., as shown in FIG. 10B, step 210; index I is put equal to zero, step 212, and the compressed data are written in memory 44 of FIG. 9, step 214. Then, filling of buffer 45 is checked again in step 202, and subsequent three data are loaded in the buffer 45 though the step sequence 202-206.

If the data loaded in the buffer 45 cannot be compressed 3×, output NO from step 208, the compression unit 43 checks whether the oldest two loaded data D(t−2) and D(t−1) in the buffer may be compressed 2× by checking whether their difference with respect to the reference datum is lower than the second threshold (e.g., they differ at most by eight bits), step 216. If so, output YES from step 216, the two oldest loaded data in the buffer are compressed by preparing a bus, e.g., as shown in FIG. 10C, step 218; index I is put equal to 1, step 220; the last loaded datum D(t) is shifted to become the oldest loaded datum D(t−2), step 222, and the compressed byte is written in memory 44 of FIG. 10, step 214. Then, two further data may be loaded in buffer 45, though the step sequence 202-206.

If the data loaded in the buffer 45 cannot be compressed 2× either, output NO from step 216, the oldest loaded datum D(t−2) in buffer 45 is prepared in a bus, not compressed, as shown in FIG. 10C, step 224; index I is put equal to 2, step 226; the two youngest loaded data D(t−1), D(t) are shifted in the buffer to become older loaded data D(t−2), D(t−1), step 228, and the compressed byte is written in memory 44 of FIG. 10, step 214. Then, one further datum may be loaded in the buffer 45, though the step sequence 202-206.

In the flowchart of FIG. 11, last saved datum may be stored in a further field or portion of buffer 45. To this aim, each time a bus is prepared, the last datum that is being compressed (or the uncompressed datum) is stored in the further field of buffer 45. In the alternative, the method may envisage temporarily storing the last datum that is saved in non-compressed form in the further field of buffer 45.

In this way, no space is wasted in the memory and the decision process as to whether the loaded data are to be compressed and in which compression form is to be used is quite simple.

According to another implementation, a complete evaluation of the three data loaded in the buffer 45 is performed. In particular, the compression unit 43 may check whether all three data loaded in the buffer 45 are compressible and in which form and take decision based on the specific sequence of data, as summarized in the table of FIG. 12.

In FIG. 12, the first column indicates the type of data loaded in the buffer 45 and the second column indicates the action taken (and specifically, in how many bytes or words—WR). In particular, in the first column, C indicates a 3×-compressible datum; D indicates a 2×-compressible datum and U indicates a non-compressible datum. In the second column, the same compressible data are indicated in brackets.

In addition, in the second column, the expressions "2 wait" and "1 wait" indicate that the algorithm waits the loading of respectively two subsequent data and one subsequent datum, analogously to the loop 202-206 of FIG. 11.

In this case, an improved (e.g., maximum) efficiency is attained. The device and the method described above have numerous advantages.

Saving more frequent data (in absolute terms, on the basis of the expected values, or in relative terms, on the basis of the previous value or values) in encoded, compressed form provides a considerable size reduction of the device data memory or an increase in its storage capacity. For instance, in the case described above, the compressed data occupy one third of the space occupied by the non-compressed data. For data of inertial sensors on mobile devices, which may have inactivity periods and thus have practically constant measured data also over long periods of time, this may lead to a considerable space saving or, alternatively, to a lengthening of the "history" of the measured data, while maintaining a considerably higher number of saved values, up to almost three times.

The device does not require structure modifications but only execution of simple additional variability verification operations during data acquisition, and similar inverse operations while reading the saved data, and thus practically zero costs.

Finally, it is clear that modifications and variations may be made to the device and to the method described and illustrated herein, without thereby departing from the scope of the present disclosure, as defined in the associated claims.

For instance, the device may comprise a different number of sensors, for example a subset, with respect to the ones illustrated in FIGS. 5A-5C.

Saving the compressed data may be performed with a different number of bits and bytes. The compression tag may arranged before the respective saved datum or be arranged differently, or be provided only in case of compressed datum or non-compressed datum, if uniquely recognizable. For instance, in the case of compression of sets of sensor data, and thus data regarding more than three axes at a time and requiring words longer than two bytes, it is possible to use a two-byte compression tag that encodes an impossible value (including a scale indication to identify a sequence of non-compressed data, or, vice versa, of compressed data). In this case, during reading, if the tag is incomprehensible, it means that the associated datum is non-compressed, otherwise it is compressed (or vice versa).

Compressed saving may be provided at a single dimension level, instead of the entire three-dimensional datum, so as to enable saving of single compressed dimensions instead of entire data, with a different organization of the bits, and different criteria of compression may be provided. For instance, compression could regard a different number of dimensions (data with six axes that include the accelerometric data XL) (for example, six axes, including the accelerometric signal XL[x,y,z] and the gyroscopic signal GY[x,y,z]). According to one embodiment, different degrees of compression could be used, using a plurality of thresholds, according to the compression degree.

Furthermore, the data saving configuration of the various sensors may be different from the above. For example, the device may save all the data coming from all the sensors at each storage cycle.

Data writing and reading processes described above are further purely illustrative and may include different steps from the ones referred to, in particular as regards verifying the value variability, for example with dynamically variable thresholds and/or comparison with average values, instead of the previous values, or the reference values may refer, instead of to the last saved datum, to the last non-compressed datum saved in the data memory 22, 32, or 44.

Finally, the signals supplied by the sensors 14, 16 may undergo possible processing operations before being acquired by the compression unit 21, 31 or 43 and/or before being processed internally by the latter prior to being saved in the data memory 44, so that the term "input data" regards the data supplied to the compression unit 21, 31, or 43.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method to manage signal data, comprising:
    acquiring an input datum from signal data generated by a plurality of different sensors, wherein the different sensors further include a plurality of different types of sensors, wherein each different sensor has its own data rate and based on a set of different data rates of the plurality of different sensors, realizing a least common multiplier of the set of different of data rates, wherein the input datum represents sensor data readings contemporaneously collected from the plurality of different types of sensors, wherein each input datum is formed as a multi-bit block of combined sensor data generated by the plurality of different types of sensors, and wherein each input datum is further processed as a single piece of data;
    advancing a counter each time a new input datum is acquired;
    if the counter has reached the least common multiplier:
        saving the new input datum in the memory; and
        resetting the counter;
    if the counter has not reached the least common multiplier:
        identifying a presence or an absence of at least one repetition condition of the new input datum;
        if the presence of the at least one repetition condition of the new input datum is identified:
            encoding in a compressed way the new input datum to generate a compressed datum; and
            saving the compressed datum in a memory; and
        if the absence of the at least one repetition condition of the new input datum is identified:
            saving the new input datum in the memory.

2. The method according to claim 1, wherein the at least one repetition condition includes one or more of a repetition frequency, a difference from a preset value, and a difference from a previous value.

3. The method according to claim 1, wherein the act of encoding in the compressed way comprises:
    deriving a difference between the input datum and a reference datum.

4. The method according to claim 3, wherein the reference datum is a previous input datum.

5. The method according to claim 4, wherein the act of deriving the input datum comprises:
    saving the input datum as an updated reference datum.

6. The method according to claim 4, wherein the act of saving the compressed datum in the memory comprises:
    saving a previous input datum as the reference datum.

7. The method according to claim 3, wherein the reference datum comprises a preset value.

8. The method according to claim 3, wherein identifying the presence or absence of at least one repetition condition of the input datum comprises:
    calculating a difference between the input datum and the reference value;
    comparing the difference with a threshold; and
    determining whether or not the difference is lower than the threshold.

9. The method according to claim 3, wherein the input datum is a multidimensional datum having a number of dimensions, and wherein identifying the presence or absence of at least one repetition condition of the input datum comprises:
    calculating a difference between each dimension of the input datum and a respective reference value;
    comparing each difference with a respective threshold; and
    determining whether or not any of the differences is lower than its respective threshold.

10. The method according to claim 9, wherein saving the compressed datum in the memory comprises:
    saving the differences if all of the calculated differences are lower than their respective thresholds.

11. The method according to claim 1, further comprising:
    saving in the memory a compression tag indicating whether the compressed datum is saved in the memory or the input datum is saved in the memory.

12. The method according to claim 11, wherein the compression tag is arranged to take a plurality of different values including a first value of the compression tag that represents saving the compressed datum in the memory, and a second value of the compression tag that represents saving the input datum in the memory.

13. The method according to claim 1, comprising:
    reading a first datum from the memory;
    verifying whether the first datum read from the memory is a first compressed datum or a first input datum; and
    interpreting the first datum based on the verifying.

14. The method according to claim 13, wherein verifying whether the first datum read from the memory is the first compressed datum or the first input datum comprises:
    reading a compression tag corresponding to the first datum;
    verifying whether or not the compression tag indicates that the first datum is compressed; and interpreting the first datum according to the compression tag verification.

15. The method according to claim 1, wherein the input datum is an angular-velocity value, an acceleration value, a magnetic-field value, a pressure value, a temperature value, a humidity value, a brightness value, a gravity value, a quaternion, a position value, a motion signal, or a physical quantity.

16. The method of claim 1, wherein identifying a presence or an absence of at least one repetition condition of the input datum comprises:
    performing a selective compression based on a speed of change of the signal data.

17. The method of claim 16, wherein performing a selective compression comprises:
    calculating a difference between the input datum and a reference value;
    comparing the difference with a first threshold;
    determining whether or not the difference is lower than the first threshold;
    compressing the datum with a first compression level if the difference is lower than the first threshold;
    comparing the difference with a second threshold if the difference is higher than the first threshold, the second threshold being higher than the first threshold;
    determining whether or not the difference is lower than the second threshold;
    compressing the datum with a second compression level, the second compression level being lower than the first compression level, if the difference is lower than the second threshold.

18. The method of claim 16, wherein performing a selective compression comprises:
    loading a plurality of input data;
    calculating differences between the loaded input data and a reference value;
    comparing the differences with a first threshold;
    determining whether or not the differences are lower than the first threshold;
    compressing the loaded data with a first compression level if all differences are lower than the first threshold;
    comparing the difference with a second threshold if any difference is higher than the first threshold, the second threshold being higher than the first threshold;
    determining whether or not the differences of at least two loaded data are lower than the second threshold;
    compressing the at least two loaded data with a second compression level, the second compression level being lower than the first compression level, if the differences of the at least two loaded data are lower than the second threshold.

19. A signal interface, comprising:
    a data memory; and
    a compression unit, the compression unit configured to:
      isolate an input datum from signal data generated by a plurality of different sensors, wherein the different sensors further include a plurality of different types of sensors, wherein each different sensor has its own data rate and based on a set of different data rates of the plurality of different sensors, realizing a least common multiplier of the set of different of data rates, wherein each input datum represents sensor data readings contemporaneously collected from the plurality of different types of sensors, wherein each input datum is formed as a multi-bit block of combined sensor data generated by the plurality of different types of sensors, and wherein each input datum is further processed as a single piece of data;
      advance a counter each a new input datum is acquired;
      compare the counter to the least common multiplier;
      when the comparison indicates the counter has reached the least common multiplier:
        save the new input datum in the data memory; and
        reset the counter;
      when the comparison indicates the counter has not reached the least common multiplier:
        verify whether or not the new input datum includes a repetition condition;
        when the new input datum includes the repetition condition, encode in a compressed way the new input datum to transform the new input datum into a compressed datum; and
        save the new input datum in the data memory in absence of the repetition condition or save the compressed datum in the data memory after verification of the repetition condition.

20. The signal interface according to claim 19, wherein the repetition condition includes a repetition frequency, a difference from a preset value, or a difference from a previous value.

21. The signal interface according to claim 19, wherein the compression unit configured to encode the input datum in the compressed way includes the compression unit configured to:
    derive a difference between the input datum and a reference datum wherein the reference datum is a previous input datum or a preset value.

22. The signal interface according to claim 21, wherein the input datum is a multidimensional datum having a number of dimensions, and wherein the compression unit configured to verify whether or not the input datum includes the repetition condition includes the compression unit configured to:
    calculate a difference between each dimension of the input datum and a respective reference value;
    compare each difference with a respective threshold; and
    determine whether or not any of the differences is lower than its respective threshold.

23. The signal interface according to claim 21 wherein the compression unit is configured to:
    save in the data memory a compression tag, wherein the compression tag is arranged to take a plurality of different values including a first value of the compression tag that represents the compressed datum is saved in the data memory, and a second value of the compression tag that represents the input datum is saved in the data memory.

24. A mobile device, comprising:
    a plurality of different sensors configured to supply output signal data, wherein the different sensors further include a plurality of different types of sensors;
    a signal interface configured to receive the output signal data;
    a data memory associated with the signal interface; and
    an application processor configured to retrieve historical data representing at least some of the output signal data supplied by the plurality of different types of sensors, wherein each different sensor has its own data rate and based on a set of different data rates of the plurality of different sensors, realizing a least common multiplier of the set of different of data rates, wherein the signal interface is configured to iteratively process batches of the output signal data, wherein each batch of output signal data represents sensor data readings contemporaneously collected from the plurality of different types of sensors, wherein each batch of output signal data is formed as a multi-bit block of combined sensor data generated by the plurality of different types of sensors, and wherein each batch of output signal data is further processed as a single piece of data, the iterative processing including:

advancing a counter during each iteration;

if the counter has reached the least common multiplier:
  storing an uncompressed version of the output signal data as historical data; and
  resetting the counter;

if the counter has not reached the least common multiplier:
  verifying whether a current batch of output signal data is repetitive of a previous batch of output signal data; and
  based on verifying repetitive output signal data, storing in the data memory a compressed version of the output signal data as historical data, or based on not verifying repetitive output signal data, storing an uncompressed version of the output signal data as historical data.

25. The mobile device according to claim 24, wherein verifying whether the current batch of output signal data is repetitive of the previous batch of output signal data includes verifying a repetition frequency, verifying a difference from a preset value, or verifying a difference from a previous value.

26. The mobile device according to claim 24, wherein the plurality of different sensors includes at least one of an inertial sensor, a position sensor, a sensor of derived signals, a motion detector, and an environmental sensor.

27. The mobile device according to claim 24, wherein the output signal data includes at least one of an angular-velocity value, an acceleration value, a magnetic-field value, a pressure value, a temperature value, a humidity value, a brightness value, a gravity value, a quaternion, a position value, a motion signal, or a physical quantity.

28. The mobile device according to claim 24, wherein the mobile device includes features of at least one of a cellular-based device, a tablet, a wearable device, an inertial-navigational device, an automotive system, and a robotic system.

29. The mobile device according to claim 24, wherein the signal interface includes:

a compression unit, the compression unit configured to generate the compressed version of the output signal data, the compressed version of the output signal data derived from a difference between a portion of the current batch of output signal data and a corresponding portion of the historical data.

30. The mobile device according to claim 29, wherein the corresponding portion of the historical data includes at least one preset value.

31. The mobile device according to claim 24, wherein the output signal data is multidimensional signal data having a number of dimensions, and wherein verifying whether the current batch of output signal data is repetitive of the previous batch of output signal data includes:

calculating a difference between each dimension of a portion of the current batch of output signal data and a respective dimension of the corresponding portion of the historical data; and comparing each difference with a respective threshold.

32. The mobile device according to claim 24, wherein verifying whether the current batch of output signal data is repetitive of the previous batch of output signal data includes:

storing in the data memory a compression tag, the compression tag arranged to take a first value if the compressed version of the output signal data is saved in the data memory as historical data, and arranged to take a second value if the uncompressed version of the output signal data is saved in the memory as historical data.

33. The mobile device according to claim 24, wherein the compressed version of the output signal data occupies less than half as much storage space in the data memory as a corresponding uncompressed version of the output signal data would occupy.

34. The method according to claim 1, wherein the plurality of different sensors include at least one accelerometer sensor, at least one gyroscopic sensor, and at least one magnetometer sensor.

35. The method according to claim 1, wherein the plurality of different sensors include at least one pressure sensor, at least one temperature sensor, and at least one humidity sensor.

36. A method to manage signal data, comprising:

contemporaneously collecting data from a plurality of different sensors, the plurality of different sensors including a plurality of different types of sensors, wherein each different sensor has its own data rate and based on a set of different data rates of the plurality of different sensors, realizing a least common multiplier of the set of different of data rates;

forming an input datum from at least some of the collected data, the input datum formed as a multi-bit block of combined sensor data generated by the plurality of different types of sensors;

acquiring and processing the input datum as a single piece of data;

advancing a counter each time an input datum is acquired;

if the counter has reached the least common multiplier:
  saving the input datum in the memory; and
  resetting the counter;

if the counter has not reached the least common multiplier:
  identifying a presence or an absence of at least one repetition condition of the input datum;
  if the presence of the at least one repetition condition of the input datum is identified:
    encoding in a compressed way the input datum to generate a compressed datum; and
    saving the compressed datum in a memory; and
  if the absence of the at least one repetition condition of the input datum is identified:
    saving the input datum in the memory.

* * * * *